(12) United States Patent
Cheng et al.

(10) Patent No.: US 8,884,390 B2
(45) Date of Patent: Nov. 11, 2014

(54) BACKSIDE ILLUMINATION IMAGE SENSOR CHIPS AND METHODS FOR FORMING THE SAME

(71) Applicant: Taiwan Semiconductor Manfacturing Company, Ltd., Hsin-Chu (TW)

(72) Inventors: I-I Cheng, Tainan (TW); Chih-Kang Chao, Tainan (TW); Volume Chien, Sinying (TW); Chi-Cherng Jeng, Madou Township (TW); Pin Chia Su, Shanhua (TW); Chih-Mu Huang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 31 days.

(21) Appl. No.: 13/754,612

(22) Filed: Jan. 30, 2013

(65) Prior Publication Data
US 2014/0210029 A1  Jul. 31, 2014

(51) Int. Cl.
*H01L 21/82* (2006.01)
*H01L 27/14* (2006.01)

(52) U.S. Cl.
CPC ............... *H01L 21/82* (2013.01); *H01L 27/14* (2013.01)

USPC ............... 257/431; 257/620; 257/E23.179; 257/E21.536; 257/E23.194; 257/E27.013

(58) Field of Classification Search
CPC ............................... H01L 21/82; H01L 27/14
USPC ............. 257/431, 620, E21.536, 599, 23.179, 257/194, 27.13
See application file for complete search history.

(56) References Cited

U.S. PATENT DOCUMENTS

| | | | |
|---|---|---|---|
| 8,338,917 B2 * | 12/2012 | Yaung et al. | 257/620 |
| 2013/0119556 A1 * | 5/2013 | Liu et al. | 257/774 |
| 2013/0122637 A1 * | 5/2013 | Tai et al. | 438/73 |
| 2014/0077320 A1 * | 3/2014 | Chen et al. | 257/431 |

\* cited by examiner

*Primary Examiner* — Michael Lebentritt
(74) *Attorney, Agent, or Firm* — Slater & Matsil, L.L.P.

(57) ABSTRACT

A die includes a first plurality of edges, and a semiconductor substrate in the die. The semiconductor substrate includes a first portion including a second plurality of edges misaligned with respective ones of the first plurality of edges. The semiconductor substrate further includes a second portion extending from one of the second plurality of edges to one of the first plurality of edges of the die. The second portion includes a first end connected to the one of the second plurality of edges, and a second end having an edge aligned to the one of the first plurality of edges of the die.

20 Claims, 9 Drawing Sheets

BACKSIDE ILLUMINATION IMAGE SENSOR CHIPS AND METHODS FOR FORMING THE SAME

BACKGROUND

Backside Illumination (BSI) image sensor chips are replacing front side illumination sensor chips for their higher efficiency in capturing photons. In the formation of the BSI image sensor chips, image sensors, such as photo diodes, and logic circuits are formed on a silicon substrate of a wafer, followed by the formation of an interconnect structure on a front side of the silicon chip. The image sensors in the BSI image sensor chips generate electrical signals in response to the stimulation of photons.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A through 3D illustrate top views and a cross-sectional views of intermediate stages in the formation of a Backside Illumination (BSI) image sensor wafer in accordance with some exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A Backside Illumination (BSI) image sensor chip and the method of forming the same are provided in accordance with various exemplary embodiments. The intermediate stages of forming the image sensor chip are illustrated. The variations of the image sensor wafer and the image sensor chip are discussed. Throughout the various views and illustrative embodiments, like reference numbers are used to designate like elements.

In the formation of the BSI image sensor chips, image sensors and logic circuits (not shown) may be formed on a silicon substrate of a wafer (not shown), followed by the formation of an interconnect structure on a front side of the silicon chip. The interconnect structure includes a plurality of metal layers including bottom metal layer M1 through top metal layer Mtop.

The wafer may then be flipped over. A backside grinding may then be performed on the silicon substrate from the backside of the silicon substrate. A buffer oxide layer may be formed over the back surface of the remaining silicon substrate, and the silicon substrate in the wafer is etched. In the etching of the silicon substrate, the portions of the silicon substrate in the scribe lines are removed. The remaining silicon substrate in each of the image sensor chip is thus isolated from the portions of the silicon substrate in other image sensor chips.

Due to the etching of the silicon substrate, trenches are formed in the silicon substrate. Openings are then formed inside the trench, wherein some portions of the STI pad and the underlying portions of interlayer dielectric (ILD) are etched, so that metal pads in the bottom metal layer M1 are exposed. Metal pads are then formed in the openings to electrically couple to the metal pads in metal layer M1. The metal pad may be used for bonding to the BSI chip.

In the above-described processes, the trench in the silicon substrate forms a grid, and the remaining portions of the silicon substrate are fully isolated from each other. This generates a stress in the remaining portions of the silicon substrate, which stress may be un-balanced, and adversely affects the devices in the silicon substrate. Such problems may be addressed by the exemplary embodiments shown in FIGS. 1 through 4.

Figure 1A:
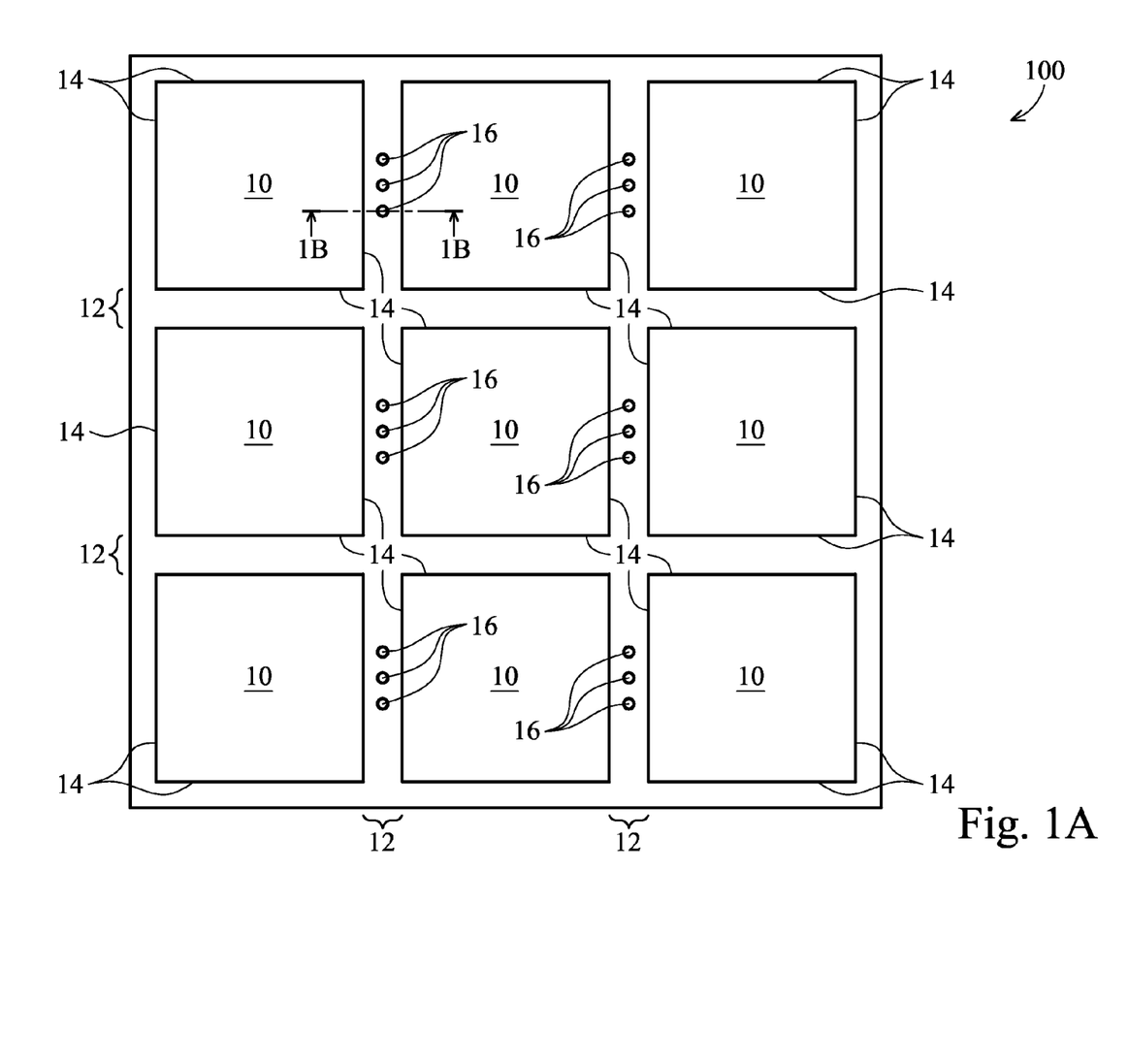

FIG. 1 illustrates a top view of wafer 100 in accordance with some exemplary embodiments. Wafer 100 includes chips 10 and the adjoining scribe lines 12. In each of chips 10, seal ring 14 is formed, wherein the outer boundaries of the seal rings 14 define the outer boundaries of chips 10. In some embodiments, there may be more than one seal ring (although one is shown), wherein outer seal rings encircle inner seal rings. In these embodiments, the illustrated seal rings 14 are the outmost seal rings among the plurality of seal rings in each of chips 10. Scribe lines 12 are portions of the wafer 100 that are between seal rings 14 of neighboring chips 10. Accordingly, each of the scribe lines 12 is between and adjoining two rows (or two columns) of chips 10, and may be between and adjoining two rows (or two columns) of seal rings 14.

In some embodiments, Within-Scribe-Line (WSL) features 16 may be formed in scribe lines 12. WSL features 16 are schematically illustrated, and may include, for example, test devices that are used for monitoring the manufacturing process of wafer 100, Scribe-line Primary Mark (SPM), overlay marks, or the like.

Figure 1B:
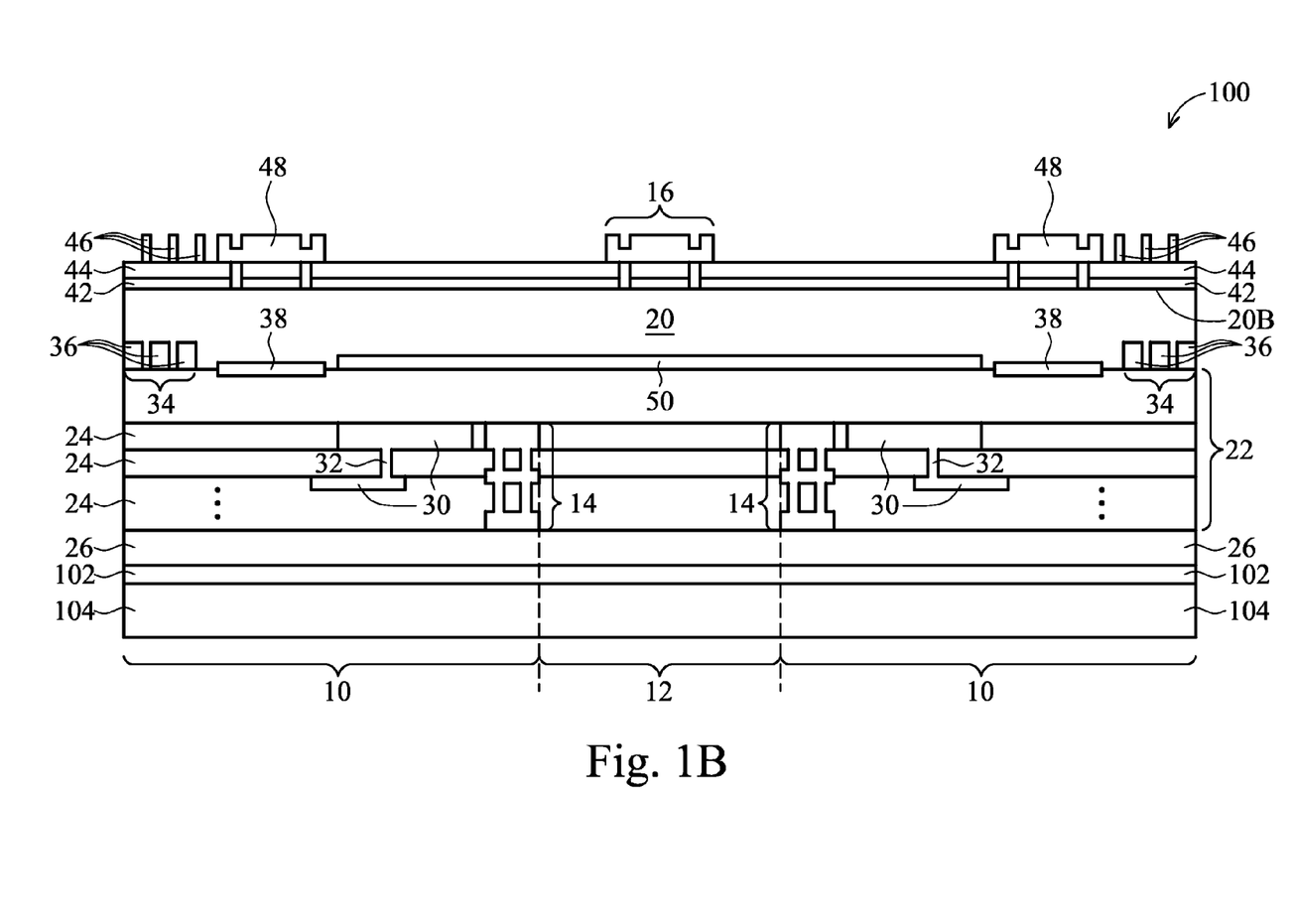

FIG. 1B illustrates a cross-sectional view of a portion of wafer 100 shown in FIG. 1A, wherein the cross-sectional view is obtained from the plane crossing line 1B-1B in FIG. 1A. As shown in FIG. 2, wafer 100 is attached to carrier 104 (which may be a glass carrier), for example, through adhesive 102. Wafer 100 includes substrate 20, which expands throughout the entirety of wafer 100 and extends into chips 10 and scribe lines 12. Substrate 20 is a semiconductor substrate comprising a semiconductor material such as silicon, silicon carbon, a III-V compound semiconductor, germanium, or the like. Interconnect structure 22 is formed on a side (referred to as a front side hereinafter) of semiconductor substrate 20. Interconnect structure 22 includes metal lines 30 and vias 32 formed in dielectric layers 24. Dielectric layers 24 may have low dielectric constants (k values), which may be lower than about 3.5, or lower than about 3.0, for example. Passivation layer(s) 26 are also included in chips 10, wherein passivation layers 26 may have non-low-k dielectric constants greater than 3.9.

In some embodiments, chips 10 are image sensor chips, which may be Backside Illumination (BSI) image sensor chips. Image sensor array 34 is formed in each of chips 10, and includes image sensors 36 allocated as a plurality of rows and columns. Image sensors 36 may be photo diodes, photo transistors, or the like, which are capable of converting photons into electrical signals. Each of chips 10 may include logic circuits 38, which are used to process electrical signals, for example, the signals generated by image sensor array 34.

Each of seal rings 14 may extend throughout all of low-k dielectric layers 24, and may, or may not, extend into passivation layer(s) 26. Seal rings 14 may also include portions (not shown) contacting substrate 20. Seal rings 14 form solid metal rings adjacent to the peripheral region of the respective chips 10, so that after wafer 100 is sawed into dies, moisture and detrimental chemicals may not penetrate into chips 10 and reach the devices and interconnect structure located within seal rings 14.

The boundaries of chips 10 and scribe line 12 are marked in FIG. 1B. WSL feature 16 is schematically illustrated, and may be formed to extend into one or more (in any combination) of substrate 20 and interconnect structure 22. Furthermore, WSL features 16 may include portions on a side (the backside) of substrate 20 opposite to the front side in which interconnect structure 22 is located. The backside portions of WSL features 16 are illustrated as being a portion over substrate 20.

Substrate 20 is thinned, for example, to a thickness of several microns. In some embodiments, over substrate 20 resides Bottom Anti-Reflective Coating (BARC) 42, which is formed on back surface 20B of semiconductor substrate 20. In some embodiments, BARC 42 comprises silicon oxynitride (SiON), although other materials may be used. Buffer oxide layer 44 is formed over BARC 42. Buffer oxide layer 44 may be formed of silicon oxide, for example, although other dielectric materials may be used. Buffer oxide layer 44 may be formed using Plasma Enhance Chemical Vapor Deposition (PECVD), and hence is sometimes referred to as a Plasma enhanced (PE) oxide, although other formation methods may be used.

In each of chips 18, metal grid 46 and metal shield 48 are formed over oxide layer 44 in accordance with some embodiments. Metal grid 46 may have a top-view shape of a grid, with the openings in the grid aligned to image sensors 36. Metal shield 48 overlaps logic circuit 38 to prevent the devices (such as transistors, diodes, etc.) in logic circuit 38 from being adversely affected by light. Metal grid 46 and metal shield 48 may be formed of titanium, titanium nitride, tantalum, tantalum nitride, aluminum copper, alloys thereof, and/or multi-layers thereof. Metal grid 46 and metal shield 48 may be formed simultaneously, and hence include same materials.

Figure 2A:
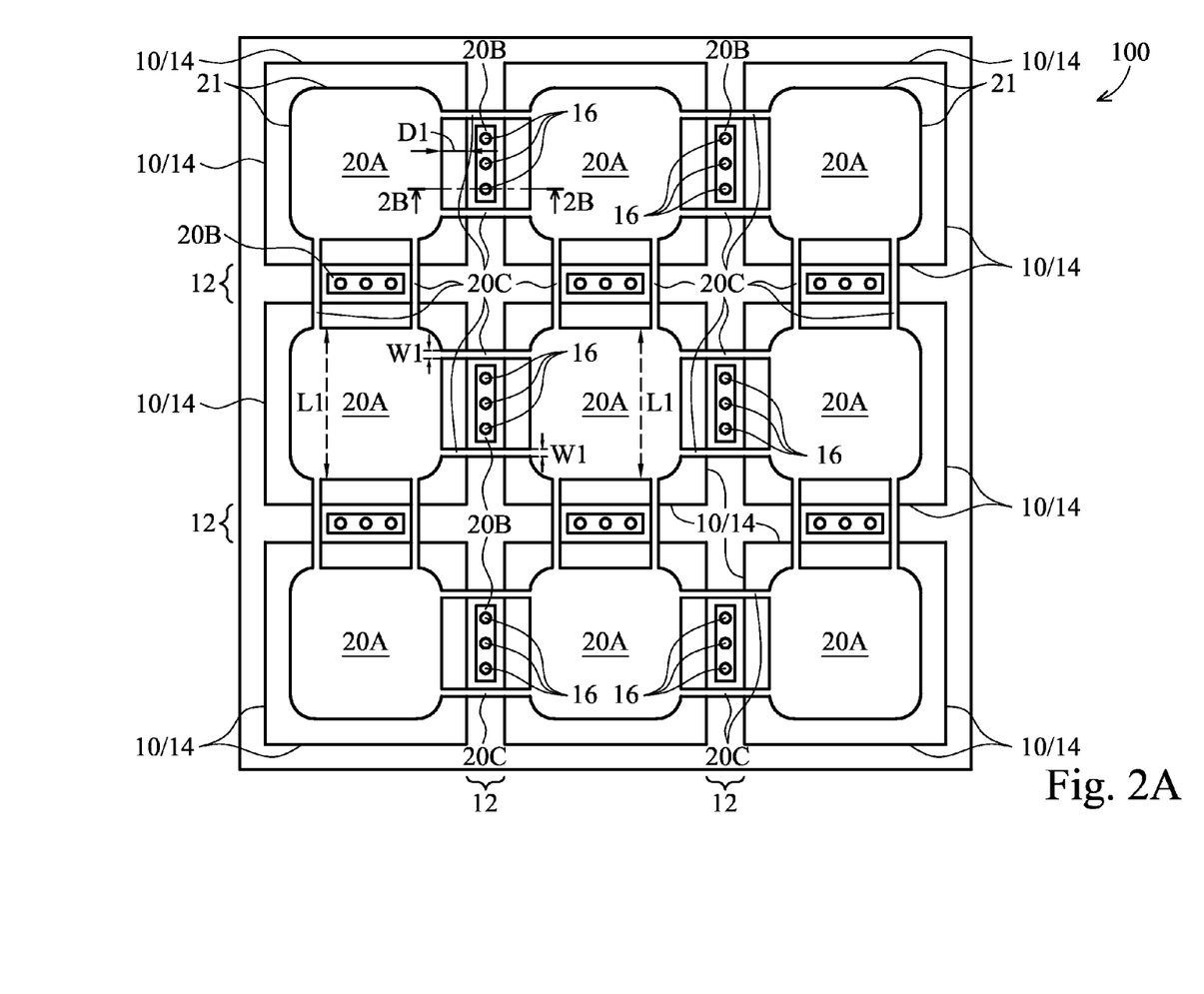
Figure 2B:
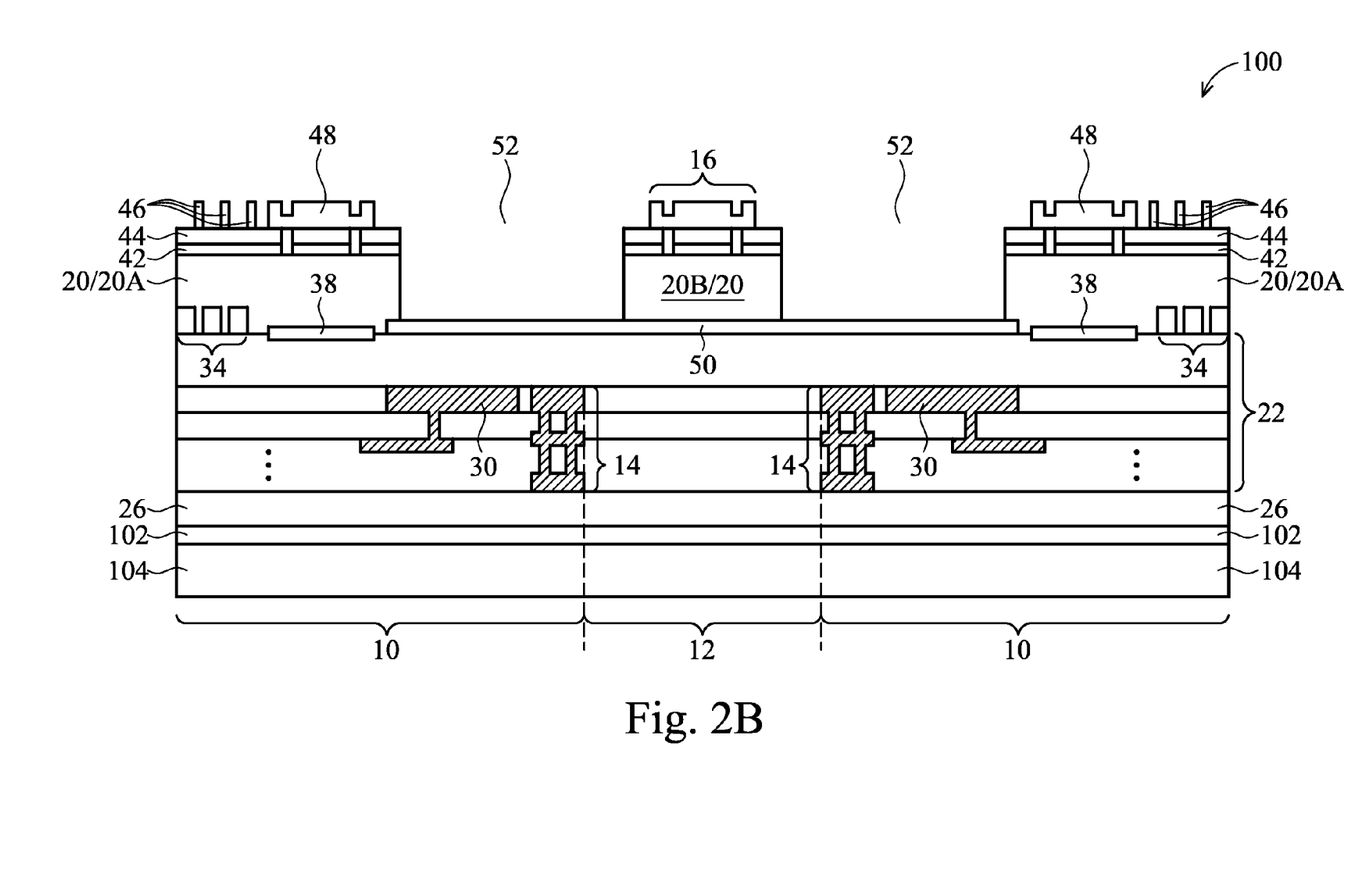

Substrate 20 and the layers over substrate 20 (including BARC 42 and oxide layer 44, for example) are then etched. The resulting structure is shown in FIGS. 2A and 2B, which are a top view and a cross-sectional view, respectively. The cross-sectional view in FIG. 2B is obtained from the plane crossing line 2B-2B in FIG. 2A. As shown in FIG. 2B, the etching is performed using Shallow Trench Isolation (STI) region 50 as an etch stop layer. Accordingly, after the etching, STI region 50 is exposed. Trench 52 is formed in substrate 20 as a result of the etching.

Referring to FIG. 2A, the etching results in substrate 20 to be patterned into a plurality of in-chip substrate portions 20A (also referred to as bulk portions), wherein each of in-chip substrate portions 20A is located within the boundaries of the respective chips 10. Furthermore, some outer portions of substrate 20 that are within chips 10 and close to the boundaries of chips 10 may also be removed by the etching step, so that edges 21 of in-chip substrate portions 20A are not aligned to the outer boundaries (defined by seal rings 14) of chips 10. Edges 21 are also inside the respective chips 10 in the top view. In some exemplary embodiments, distance D1 between the edges 21 and the respective edges of chip 10 is greater than about 100 μm. The remaining portions of substrate 20 also include substrate portions 20B, which are the portions at which WSL features 16 are formed.

In addition, the remaining portions of substrate 20 also include substrate portions 20C, wherein each of substrate portions 20C interconnects two substrate portions 20A. Substrate portions 20C have lengths significantly greater than their widths, and hence are also referred to as substrate strips 20C hereinafter. Each of substrate portions 20C may cross an entirety of a scribe line 12, and may extend into two neighboring chips 10. Through substrate portions 20C, all substrate portions 20A in wafer 100 may be interconnected, although substrate portions 20A themselves are disconnected from each other. In some embodiments, each edge 21 of portion 20A is connected to one, two, three, or more substrate strips 20C. In the illustrated embodiments, there are two substrate strips 20C connected to the opposite edges of the same edge 21, with a portion 20B in between. Width W1 of substrate strips 20C may be between about 20 μm and about 80 μm. In some embodiments, width W1 is between about 0.5 percent and about 2.0 percent of length L1 of the respective side of the corresponding substrate portion 20A. Substrate strips 20C may have longitudinal directions perpendicular to the respective edge 21 it connects to. Since each portion 20A may include four sides, substrate strips 20C are formed to connect to four sides of portion 20A. In some embodiments, substrate portion 20B is disconnected from substrate portions 20A and substrate strips 20C.

Substrate portions 20A may have adverse stress after the substrate etching step, which adverse stress affects the performance of the devices in chip 10. With substrate strips 20C interconnecting neighboring substrate portions 20A of neighboring chips 10, a force is provided to push or pull neighboring substrate portions 20A, so that the adverse stress is at least reduced, or substantially eliminated.

Figure 3A:
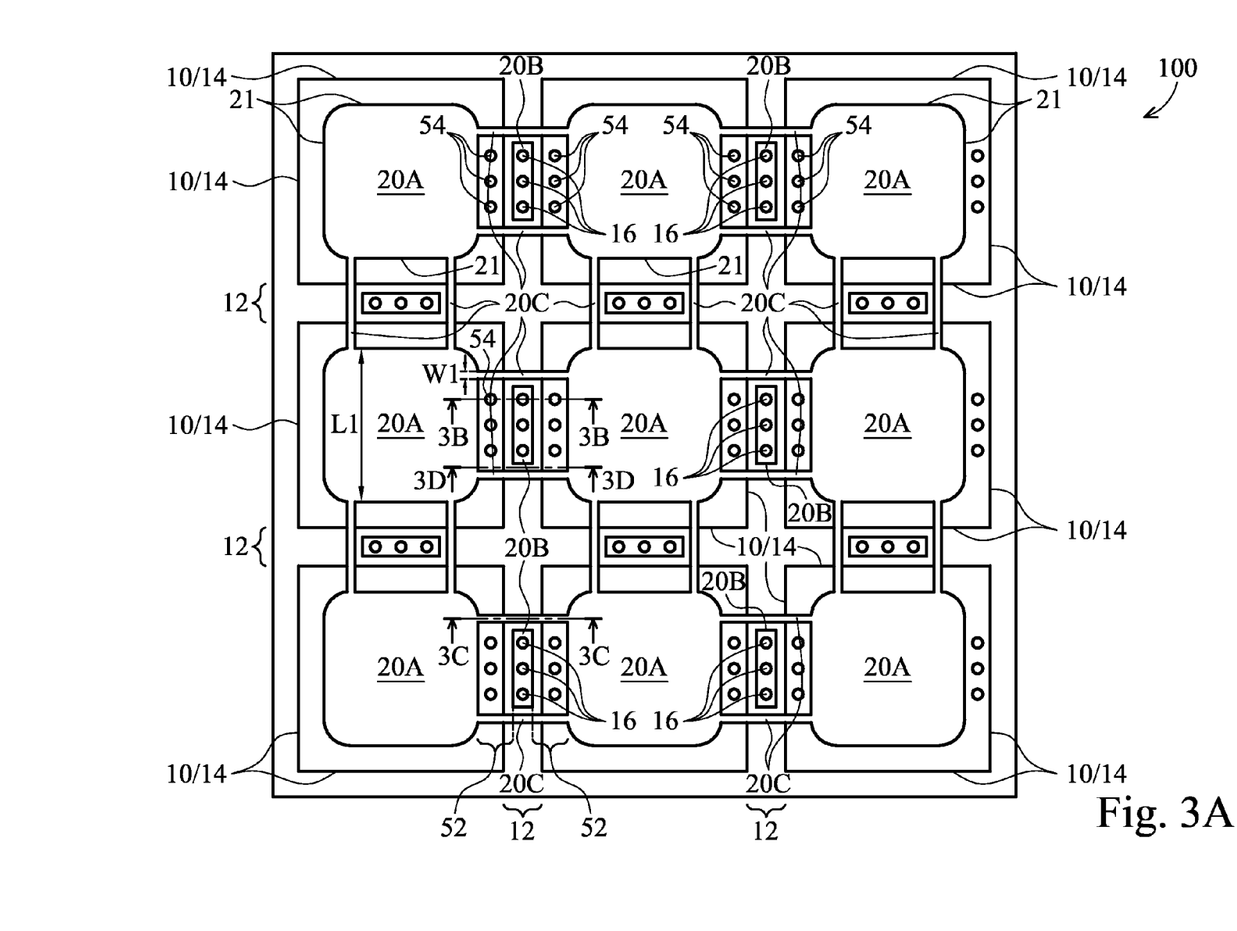
Figure 3B:
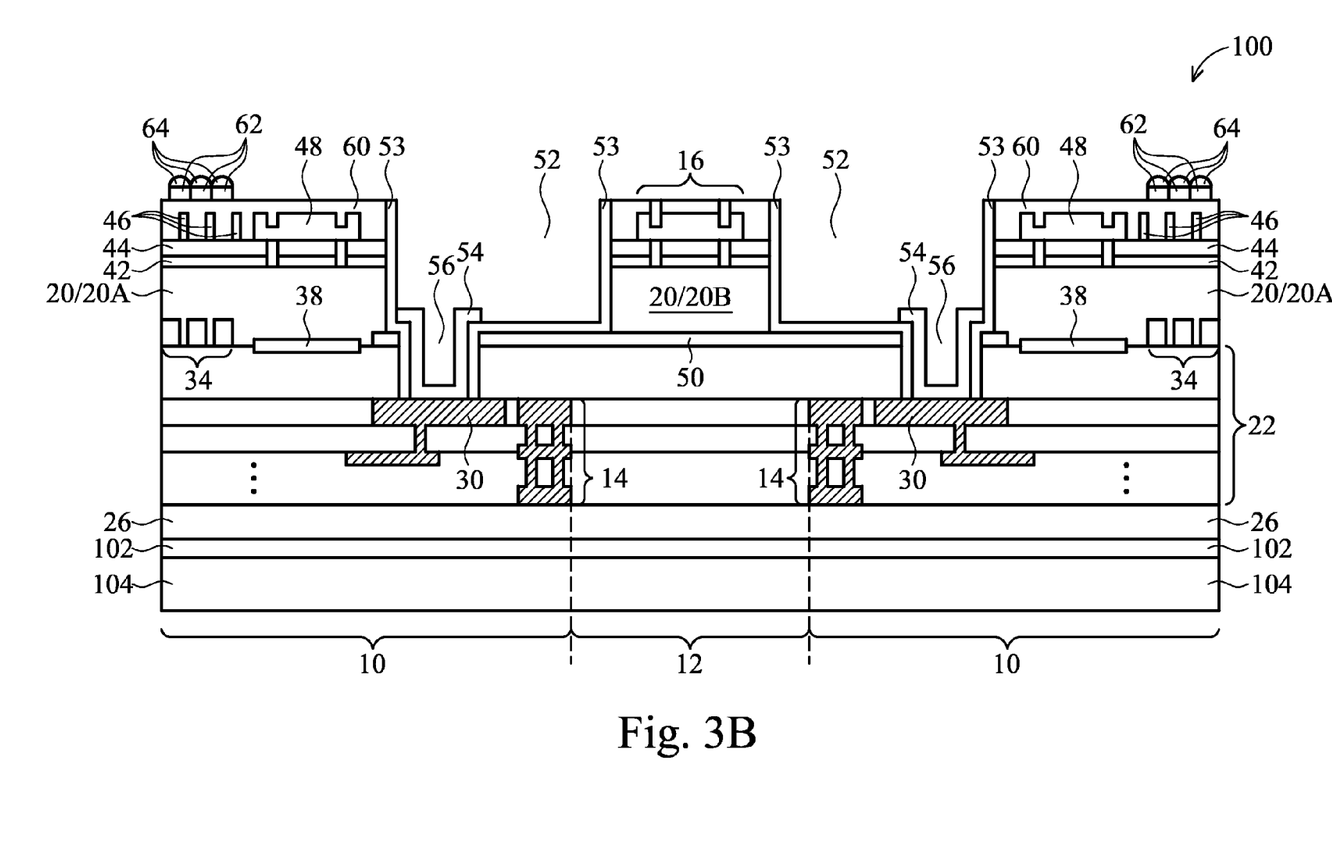
Figure 3C:
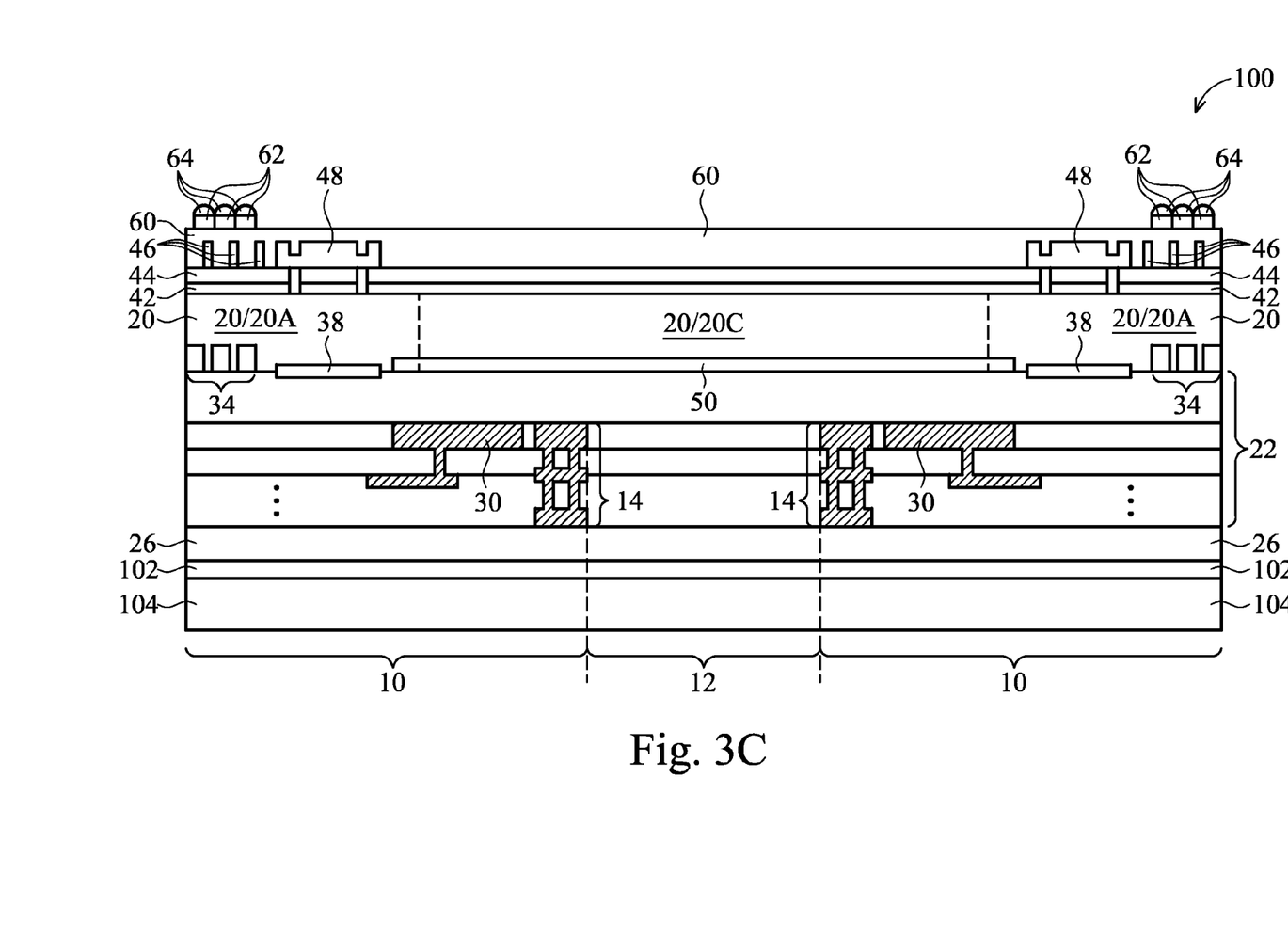
Figure 3D:
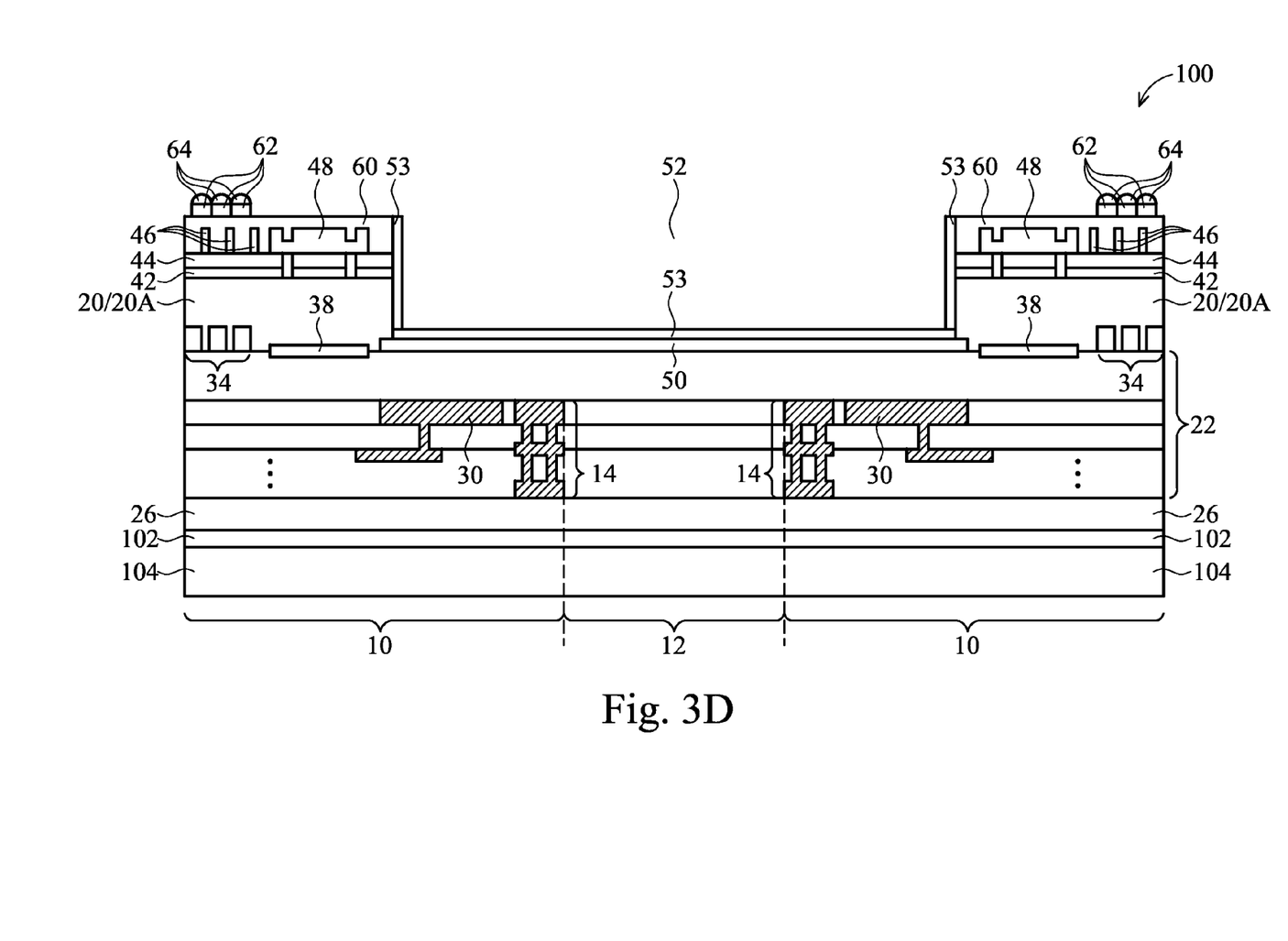

Referring to FIGS. 3A through 3D, the remaining features of wafer 100 are formed. FIGS. 3B, 3C, and 3D illustrate the cross-sectional views obtained from the planes crossing lines 3B-3B, 3C-3C, and 3D-3D, respectively, in FIG. 3A. FIGS. 3A and 3B illustrate bond pads 54 formed in chips 10. Bond pads 54 penetrate through STI region 50, and are electrically connected to the metal layers on the front side of substrate 20. In some embodiments, the formation process includes forming openings 56 in STI region 50, wherein openings 56 are further formed in trenches 52 that are formed due to the removal of substrate 20. Dielectric layer 53 is formed to cover sidewalls of trenches 52 and openings 56. Some horizontal portions of dielectric layer 53 are removed to expose one of metal pads 30, which may be in a metal layer such as the bottom metal layer (M1) or another metal layer. A conductive layer (not shown) is then formed to extend into openings 56, and is then patterned. The remaining portions of the conductive layer form bond pads 54, which extend into openings 56. Bond pads 54 are electrically coupled to interconnect structure 22, and may be electrically coupled to image sensor array 34 and/or logic circuit 38.

Furthermore, as shown in FIGS. 3B, 3C, and 3D, the remaining components of BSI chip 10, including dielectric layer 60, color filters 62, micro-lenses 64, and the like, are formed. Dielectric layer 60 may fill the gaps between metal grid 46 and metal shield 48, so that a flat top surface may be formed for the subsequent formation of color filters 62 and micro-lenses 64. Each of color filters 62 and micro-lenses 64 may be aligned to one of image sensors 36. The cross-sectional view in FIG. 3B is obtained from the plane crossing bond pads 54 and portion 20B of substrate 20, and hence bond pads 54 and portion 20B are illustrated. The cross-sectional view in FIG. 3C is obtained from the plane in which substrate strip 20C is located, and hence substrate portions 20A and 20C are both illustrated in the same view. The cross-sectional view in FIG. 3D is obtained from the plane in which no bond pads 54 and substrate portion 20C exist, and hence trench 52 is shown as extending throughout scribe line 12, and extending into neighboring chips 10.

Figure 4:
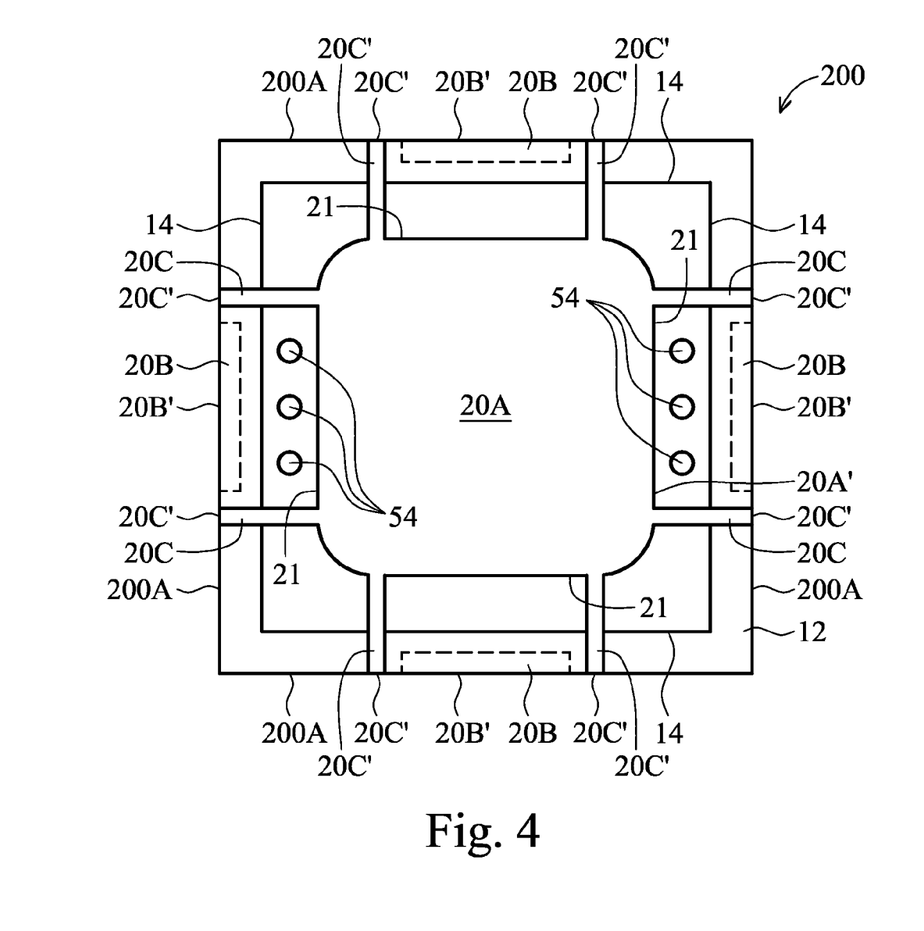
FIG. 4 illustrates a top view of a BSI image sensor chip sawed from the BSI image sensor wafer in accordance with some embodiments.

Next, after wafer 100 in FIGS. 3A-3D is formed, wafer 100 is diced along scribe lines 12, so that a plurality of identical dies are formed. FIG. 4 illustrates a top view of one of dies 200, which includes chip 10 therein. The illustrated die 200, besides the portion of chip 10 shown in FIG. 3A, may also include residue portions of scribe lines 12 shown in FIG. 3A. Further, each of substrate strips 20C is sawed, and each of substrate strips 12 has a portion remaining in die 200. Substrate portion 20A may include four edges 21, which are substantially parallel to the respective edges 200A of die 200. The remaining portions of substrate strips 20C have edges 20C', which are generated due to the sawing. Edges 20C' are aligned to the respective edges 200A of die 200. There may be two or more substrate strips 20C connected to a same edge 21 in order to maximize the benefit of reducing stress, although in other embodiments, there is a single substrate strip 20C connected to one edge 21. In some embodiments, substrate portions 20B (FIG. 3A) are fully sawed, and hence substrate portions 20B are not in die 200. In alternative embodiments, substrate portions 20B may have some residues left. Accordingly, substrate portions 20B are illustrated using dashed lines to indicate that they may, or may not exist. In accordance with the illustrated embodiments, each of substrate portions 20B is located between two substrate strips 20C that are connected to the same edge 21. In the case substrate portions 20B have portions remaining in die 200, an edge 20B' of each of substrate portions 20B is aligned to one of edges 200A due to the step of sawing. Substrate strips 20C cross over seal ring 14. Accordingly, some portions of substrate strips 20C are outside of seal ring 14, and some other portions of substrate strips 20C are inside seal ring 14.

In the embodiments of the present disclosure, by leaving substrate strips un-etched when the respective substrate is etched, the substrate strips may interconnect the substrate portions in the image sensor chips as an integrated unit. When the substrate portions in the image sensor chips have and/or suffer from stresses, the substrate strips may push or pull the neighboring substrate portions, so that the adverse stress caused by the partial removal of substrate is at least reduced, or substantially eliminated. The formation of the substrate strips does not require additional manufacturing cost since the substrate strips are formed simultaneously with the step of etching the substrate. After the dicing of the wafer, the remaining portions of the substrate strips may be observable in the resulting dies.

In accordance with some embodiments, a die includes a first plurality of edges, and a semiconductor substrate in the die. The semiconductor substrate includes a first portion including a second plurality of edges misaligned with respective ones of the first plurality of edges. The semiconductor substrate further includes a second portion extending from one of the second plurality of edges to one of the first plurality of edges of the die. The second portion includes a first end connected to the one of the second plurality of edges, and a second end having an edge aligned to the one of the first plurality of edges of the die.

In accordance with other embodiments, a BSI image sensor die includes a first plurality of edges, and a seal ring including a plurality of sides, with each of the plurality of sides adjacent to, and parallel to, one of the first plurality of edges. A semiconductor substrate is in the BSI image sensor die. The semiconductor substrate includes a bulk portion within the seal ring, wherein the first portion has a second plurality of edges, each adjacent to, and parallel to, one of the first plurality of edges. The semiconductor substrate further includes a plurality of strips, with each of the plurality of strips connected to one of the second plurality of edges. Each of the plurality of strips extends from inside the seal ring to outside the seal ring.

In accordance with yet other embodiments, a method includes forming a plurality of integrated circuit devices in each of a plurality of chips of a wafer, and etching a semiconductor substrate of the wafer into a plurality of portions. The plurality of portions of the semiconductor substrate includes a plurality of bulk portions, each in one of the plurality of chips, and a plurality of strip portions, each interconnecting two of the plurality of bulk portions that are located in two neighboring chips.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a die comprising:
      a first plurality of edges; and
      a semiconductor substrate in the die, wherein the semiconductor substrate comprises:
         a first portion comprising a second plurality of edges misaligned with respective ones of the first plurality of edges; and
         a second portion extending from one of the second plurality of edges to one of the first plurality of edges of the die, wherein the second portion comprises a first end connected to the one of the second plurality of edges, and a second end having an edge aligned to the one of the first plurality of edges of the die.

2. The device of claim 1, wherein the semiconductor substrate comprises a plurality of portions extending from a same one of the second plurality of edges of the first portion to a same one of the first plurality of edges of the die.

3. The device of claim 2, wherein the plurality of portions of the semiconductor substrate has longitudinal directions parallel to each other, and perpendicular to the same one of the first plurality of edges of the die.

4. The device of claim 1, wherein the die further comprises a seal ring adjacent to edges of the die, and wherein the second portion crosses over the seal ring and extends from inside the seal ring to outside the seal ring.

5. The device of claim 1, wherein the die further comprises a seal ring adjacent to edges of the die, wherein the semiconductor substrate further comprises a third portion outside of the seal ring, and wherein the third portion is disconnected from the first portion and the second portion of the semiconductor substrate.

6. The device of claim 1 further comprising a bond pad between a first one of the first plurality of edges of the die and a second one of the second plurality of edges in a top view of the device, wherein the first one and the second one are parallel to each other.

7. The device of claim 1 further comprising:
a plurality of image sensors in the die; and
a plurality of color filters and micro-lenses aligned to the plurality of image sensors.

8. A device comprising:
a Backside Illumination (BSI) image sensor die comprising:
a first plurality of edges;
a seal ring comprising a plurality of sides, with each of the plurality of sides adjacent to, and parallel to, one of the first plurality of edges; and
a semiconductor substrate in the BSI image sensor die, wherein the semiconductor substrate comprises:
a bulk portion within the seal ring, wherein the bulk portion comprises a second plurality of edges, each adjacent to, and parallel to, one of the first plurality of edges; and
a plurality of strips, with each of the plurality of strips connected to one of the second plurality of edges, wherein each of the plurality of strips extends from inside the seal ring to outside the seal ring.

9. The device of claim 8, wherein each of the plurality of strips of the semiconductor substrate extends to, and comprises an edge aligned to, one of the first plurality of edges.

10. The device of claim 9, wherein the each of the plurality of strips of the semiconductor substrate has a longitudinal direction perpendicular to the one of the first plurality of edges.

11. The device of claim 8 further comprising:
a plurality of image sensors in the BSI image sensor die; and
a plurality of color filters and micro-lenses aligned to the plurality of image sensors.

12. The device of claim 8, wherein a first edge in the first plurality of edges of the die is parallel to a second edge in the second plurality of edges of the bulk portion of the semiconductor substrate, and wherein the device further comprises a bond pad between the first edge and the second edge.

13. The device of claim 8, wherein the semiconductor substrate further comprises a portion outside the seal ring, and between the seal ring and one of the first plurality of edges, wherein the portion of the semiconductor substrate comprises an edge aligned to one of the first plurality of edges, and wherein the portion of the semiconductor substrate is disconnected from the bulk portion and the plurality of strips of the semiconductor substrate.

14. The device of claim 8, wherein the semiconductor substrate comprises two of the plurality of strips connected to each of the second plurality of edges of the bulk portion of the semiconductor substrate.

15. A device comprising:
a die comprising:
a die edge;
a seal ring comprising a first outer edge parallel to a die edge, wherein the first outer edge and the die edge have a first distance; and
a semiconductor substrate comprising:
a bulk portion comprising a second outer edge parallel to the die edge, wherein the second outer edge and the die edge have a second distance greater than the first distance; and
a first strip portion extending from the second outer edge to the die edge, wherein the first strip portion comprises a first end connected to the second outer edge.

16. The device of claim 15, wherein the first strip portion of the semiconductor substrate comprises a second end opposite to the first end, wherein the second end is aligned to the die edge.

17. The device of claim 15, wherein the first strip portion of the semiconductor substrate comprises two opposite edges parallel to each other, wherein the two opposite edges are connected to, and are perpendicular to, the second outer edge.

18. The device of claim 15, wherein semiconductor substrate further comprises a second strip portion extending from the second outer edge to the die edge, wherein the first strip portion and the second strip portion are parallel to each other, and are physically spaced apart from each other.

19. The device of claim 15 further comprising an additional portion of the semiconductor substrate physically separated from the bulk portion and the first strip portion of the semiconductor substrate, wherein the additional portion of the semiconductor substrate is located between the second outer edge and the die edge.

20. The device of claim 19, wherein the additional portion of the semiconductor substrate comprises a first edge aligned to the die edge, and a second edge parallel to, and spaced apart from, the second outer edge of the bulk portion.

\* \* \* \* \*